US009570557B2

(12) United States Patent
Chou et al.

(10) Patent No.: US 9,570,557 B2
(45) Date of Patent: Feb. 14, 2017

(54) TILT IMPLANTATION FOR STI FORMATION IN FINFET STRUCTURES

(71) Applicant: TAIWAN SEMICONDUCTOR MANUFACTURING CO., LTD., Hsinchu (TW)

(72) Inventors: Chen Cheng Chou, Tainan County (TW); Chung-Ren Sun, Kaohsiung (TW); Chii-Ming Wu, Taipei (TW); Cheng-Ta Wu, Chiayi County (TW); Tzu kai Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/700,067

(22) Filed: Apr. 29, 2015

(65) Prior Publication Data
US 2016/0322462 A1 Nov. 3, 2016

(51) Int. Cl.
| | |
|---|---|
| *H01L 29/78* | (2006.01) |
| *H01L 29/10* | (2006.01) |
| *H01L 29/66* | (2006.01) |
| *H01L 29/06* | (2006.01) |
| *H01L 21/225* | (2006.01) |
| *H01L 21/306* | (2006.01) |

(52) U.S. Cl.
CPC ....... *H01L 29/1054* (2013.01); *H01L 21/2253* (2013.01); *H01L 21/30604* (2013.01); *H01L 29/0649* (2013.01); *H01L 29/66795* (2013.01); *H01L 29/785* (2013.01); *H01L 29/7849* (2013.01)

(58) Field of Classification Search
USPC .................... 257/347, 401; 438/300
See application file for complete search history.

(56) References Cited

U.S. PATENT DOCUMENTS

| | | | |
|---|---|---|---|
| 7,425,740 B2 | 9/2008 | Liu et al. | |
| 7,667,271 B2 * | 2/2010 | Yu ................ | H01L 21/26586 257/347 |
| 8,048,723 B2 | 11/2011 | Chang et al. | |
| 8,053,299 B2 | 11/2011 | Xu | |

(Continued)

OTHER PUBLICATIONS

Office Action Taiwanese Patent Application No. 10521008060 dated Aug. 16, 2016.

*Primary Examiner* — Hrayr A Sayadian
(74) *Attorney, Agent, or Firm* — McDermott Will & Emery LLP

(57) ABSTRACT

Techniques in fabricating a fin field-effect transistor (FinFET) include providing a substrate having a fin structure and forming an isolation region having a top surface with a first surface profile. A dopant species is implanted using a tilt angle to edge portions of the top surface. The edge portions are then removed using an etch process. In this respect, the isolation region is modified to have a second surface profile based on an etching rate that is greater than an etching rate used at other portions of the top surface. The second surface profile has a step height that is smaller than a step height corresponding to the first surface profile. The tilt implantation and etching process can be performed before a gate structure is formed, after the gate structure is formed but before the fin structure is recessed, or after the fin structure is recessed.

20 Claims, 13 Drawing Sheets

(56) References Cited

U.S. PATENT DOCUMENTS

| | | |
|---|---|---|
| 8,183,627 B2 | 5/2012 | Currie |
| 8,362,575 B2 | 1/2013 | Kwok et al. |
| 8,367,498 B2 | 2/2013 | Chang et al. |
| 8,415,718 B2 | 4/2013 | Xu |
| 8,440,517 B2 | 5/2013 | Lin et al. |
| 8,487,378 B2 | 7/2013 | Goto et al. |
| 8,497,177 B1 | 7/2013 | Chang et al. |
| 8,497,528 B2 | 7/2013 | Lee et al. |
| 8,609,518 B2 | 12/2013 | Wann et al. |
| 8,610,240 B2 | 12/2013 | Lee et al. |
| 8,618,556 B2 | 12/2013 | Wu et al. |
| 8,633,516 B1 | 1/2014 | Wu et al. |
| 8,680,576 B2 | 3/2014 | Ching et al. |
| 8,703,565 B2 | 4/2014 | Chang et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,742,509 B2 | 6/2014 | Lee et al. |
| 8,776,734 B1 | 7/2014 | Roy et al. |
| 8,785,285 B2 | 7/2014 | Tsai et al. |
| 8,796,666 B1 | 8/2014 | Huang et al. |
| 8,796,759 B2 | 8/2014 | Perng et al. |
| 8,809,139 B2 | 8/2014 | Huang et al. |
| 8,815,712 B2 | 8/2014 | Wan et al. |
| 8,826,213 B1 | 9/2014 | Ho et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,887,106 B2 | 11/2014 | Ho et al. |
| 2008/0149984 A1 | 6/2008 | Chang et al. |
| 2008/0265321 A1* | 10/2008 | Yu .................. H01L 21/26586 257/344 |
| 2009/0184358 A1 | 7/2009 | Lenoble et al. |
| 2011/0068407 A1 | 3/2011 | Yeh et al. |
| 2013/0011983 A1 | 1/2013 | Tsai et al. |
| 2013/0228862 A1 | 9/2013 | Lee et al. |
| 2013/0285153 A1 | 10/2013 | Lee et al. |
| 2014/0183600 A1 | 7/2014 | Huang et al. |
| 2014/0252412 A1 | 9/2014 | Tsai et al. |
| 2014/0264590 A1 | 9/2014 | Yu et al. |
| 2014/0264592 A1 | 9/2014 | Oxland et al. |
| 2014/0282326 A1 | 9/2014 | Chen et al. |
| 2014/0312471 A1 | 10/2014 | Hong |
| 2014/0361354 A1 | 12/2014 | Ting et al. |
| 2015/0024561 A1 | 1/2015 | Li et al. |

\* cited by examiner

TILT IMPLANTATION FOR STI FORMATION IN FINFET STRUCTURES

RELATED APPLICATIONS

This is a Non-Provisional of U.S. Patent Provisional Application No. 62/116,321, filed on Feb. 13, 2015, the entire disclosure of which is incorporated herein by reference.

BACKGROUND

With increasing down-scaling of integrated circuits and increasingly demanding requirements to speed of integrated circuits, transistors need to have higher drive currents with increasingly smaller dimensions. Fin Field-Effect Transistors (FinFET) were thus developed. FinFETs include vertical semiconductor fins above a substrate. The semiconductor fins are used to form source and drain regions, and channel regions between the source and drain regions. Shallow Trench Isolation (STI) regions are formed to define the semiconductor fins. The FinFETs also include gate stacks, which are formed on the sidewalls and the top surfaces of the semiconductor fins.

In the formation of the STI regions, various clean steps are performed. These steps cause recess of the top surfaces of STI regions. As a result of the clean steps, the center portions of the top surfaces of the STI regions are lower than edge portions of the top surfaces of the STI regions. The STI regions with such a surface profile can impact the performance of the FinFET.

BRIEF DESCRIPTION OF THE DRAWINGS

Aspects of the present disclosure are best understood from the following detailed description when read with the accompanying figures. It is to be understood that the following disclosure provides many different embodiments, or examples, for implementing different features of the present disclosure. Specific examples of components and arrangements are described below to simplify the present disclosure. These are, of course, merely examples and are not intended to be limiting. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
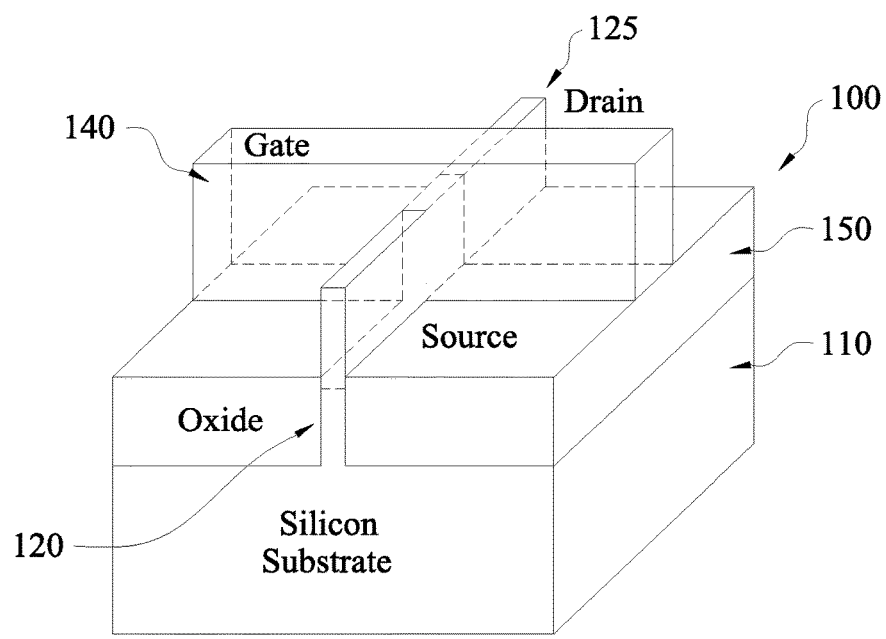
FIG. 1A is an exemplary perspective view of a Fin Field-Effect Transistor (FinFET) device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1B:
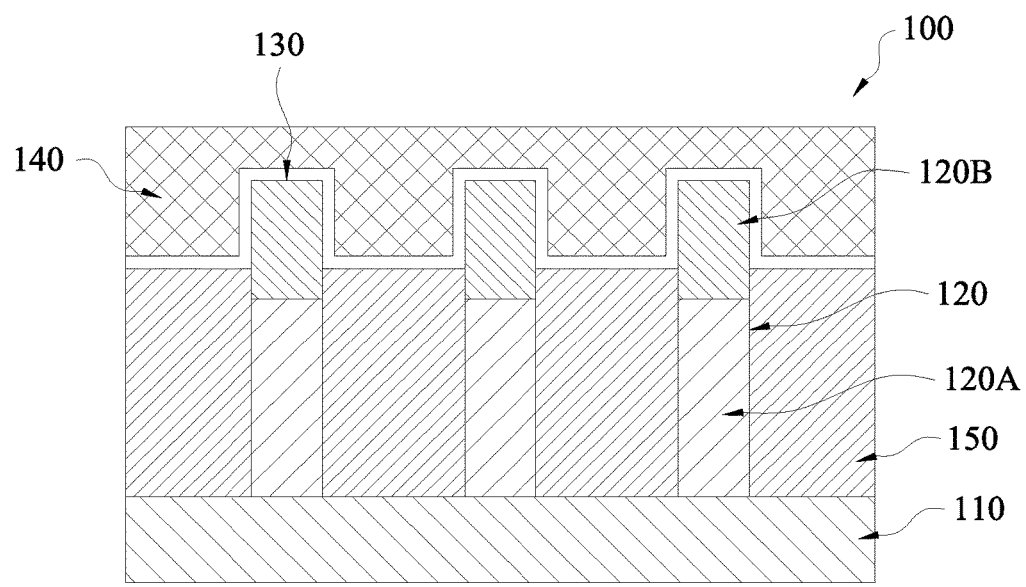
FIG. 1B is an exemplary cross sectional view of the FinFET device having a fin structure along a gate electrode in accordance with some embodiments of the present disclosure.

FIG. 1A is an exemplary perspective view of a Fin Field-Effect Transistor (FinFET) device 100 having a fin structure according to one embodiment of the present disclosure, and FIG. 1B is an exemplary cross sectional view of the FinFET device 100 having a fin structure along a gate electrode according to one embodiment of the present disclosure. In these figures, some layers/features are omitted for simplification.

The FinFET device 100 depicted in FIGS. 1A and 1B includes, among other features, a substrate 110, a fin structure 120, a gate dielectric 130 and a gate electrode 140. In this embodiment, the substrate 110 is a silicon substrate. Alternatively, the substrate 110 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 110 is a silicon layer of an SOI (silicon-on insulator) substrate. When an SOI substrate is used, the fin structure 120 may protrude from the silicon layer of the SOI substrate or may protrude from the insulator layer of the SOI substrate. In the latter case, the silicon layer of the SOI substrate is used to form the fin structure 120. Amorphous substrates, such as amorphous Si or amorphous SiC, or insulating material, such as silicon oxide may also be used as the substrate 110. The substrate 110 may include various regions that have been suitably doped with impurities (e.g., p-type or n-type conductivity).

The fin structure 120 is disposed over the substrate 110. The fin structure 120 may be made of the same material as the substrate 110 and may continuously extend from the substrate 110. In this embodiment, the fin structure is made of silicon (Si). The silicon layer of the fin structure 120 may be intrinsic, or appropriately doped with an n-type impurity or a p-type impurity.

In FIG. 1A, one fin structure 120 is disposed over the substrate 110, while in FIG. 1B, three fin structures 120 are disposed over the substrate 110. However, the number of the fin structures is not limited to three. The numbers may be one, two or four or more. In addition, one or more dummy fin structures may be disposed adjacent to both sides of the fin structures 120 to improve pattern fidelity in patterning processes. The width of the fin structure 120 is in a range of about 5 nm to about 40 nm in some embodiments, and may be in a range of about 7 nm to about 12 nm in certain embodiments. The height of the fin structure 120 is in a range of about 100 nm to about 300 nm in some embodiments, and may be in a range of about 50 nm to 100 nm in other embodiments.

The lower part of the fin structure 120 under the gate electrode 140 is referred to as a well layer 120A, and the upper part of the fin structure 120 is referred to as a channel layer 120B, as shown in FIG. 1B. Under the gate electrode 140, the well layer 120A is embedded in the isolation insulating layer 150, and the channel layer 120B protrudes from the isolation insulating layer 150. A lower part of the channel layer 120B may also be embedded in the isolation insulating layer 150 to a depth of about 1 nm to about 5 nm.

Further, spaces between the fin structures 120 and/or a space between one fin structure and another element formed over the substrate 110 are filled by an isolation insulating layer 150 (or so-called a "shallow-trench-isolation (STI)" layer) including an insulating material. The insulating material for the isolation insulating layer 150 may include silicon oxide, silicon nitride, silicon oxynitride (SiON), SiOCN, fluoride-doped silicate glass (FSG), or a low-K dielectric material.

The channel layer 120B protruding from the isolation insulating layer 150 is covered by a gate dielectric layer 130, and the gate dielectric layer 130 is further covered by a gate electrode 140. Part of the channel layer 120B not covered by the gate electrode 140 functions as a source and/or drain of the MOS FET (see, FIG. 1A).

In certain embodiments, the gate dielectric layer 130 includes a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate electrode 140 includes any suitable material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate structure may be formed using a gate-last or replacement gate methodology.

In certain embodiments of the present disclosure, one or more work function adjustment layers (not shown) may be interposed between the gate dielectric layer 130 and the gate electrode 140. The work function adjustment layer may include a single layer or alternatively a multi-layer structure, such as various combinations of a metal layer with a selected work function to enhance the device performance (work function metal layer), liner layer, wetting layer, adhesion layer, metal alloy or metal silicide. The work function adjustment layers are made of a conductive material such as a single layer of Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials, or a multilayer of two or more of these materials. In some embodiments, the work function adjustment layer may include a first metal material for the n-channel Fin FET and a second metal material for the p-channel Fin FET. For example, the first metal material for the n-channel Fin FET may include metals having a work function substantially aligned with a work function of the substrate conduction band, or at least substantially aligned with a work function of the conduction band of the channel layer 120B. Similarly, for example, the second metal material for the p-channel Fin FET may include metals having a work function substantially aligned with a work function of the substrate valence band, or at least substantially aligned with a work function of the valence band of the channel layer 120B. In some embodiments, the work function adjustment layer may alternatively include a polysilicon layer. The work function adjustment layer may be formed by ALD, PVD, CVD, e-beam evaporation, or other suitable process. Further, the work function adjustment layer may be formed separately for the n-channel Fin FET and the p-channel Fin FET which may use different metal layers.

Source and drain regions 125 are also formed in the upper part of the fin structure 120 not covered by the gate electrode 140, by appropriately doping impurities in the source and drain regions 125. An alloy of Si or Ge and a metal such as Co, Ni, W, Ti or Ta may be formed on the source and drain regions 125.

In the formation of the isolation insulating layer 150, cleaning operations including an etching process are used to recess a top surface of the isolation insulating layer 150 to form the fin structures 120. As a result of the cleaning operation, a center portion of the top surface appears lower than corner portions of the top surface, which is adjacent to sidewalls of the fin structures 120. In this respect, the top surface of the isolation insulating layer 150 is referred to as having a concave surface profile.

The concave surface profile having a sidewall angle greater than +45 degrees may adversely affect the performance of the FinFET device 100. For example, the concave surface profile may cause a decrease in the surface area of the active region (e.g., the channel layer 120B). The concave surface profile also may constrain the shape of epitaxial growth during the formation of the FinFET device 100. As such, the drive current during on/off operational states of the FinFET device 100 may be adversely impacted thereby affecting the performance of a respective integrated circuit.

Figure 7A:
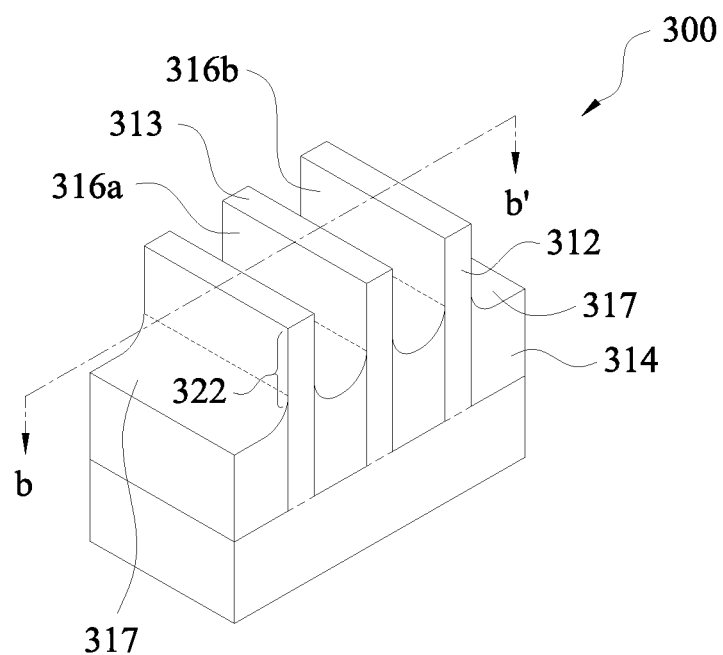
FIGS. 7A-7D illustrate examples of cross-sectional views of an intermediate stage in the fabrication of a FinFET structure including an exemplary tilt implantation in accordance with some embodiments of the present disclosure.
Figure 7B:
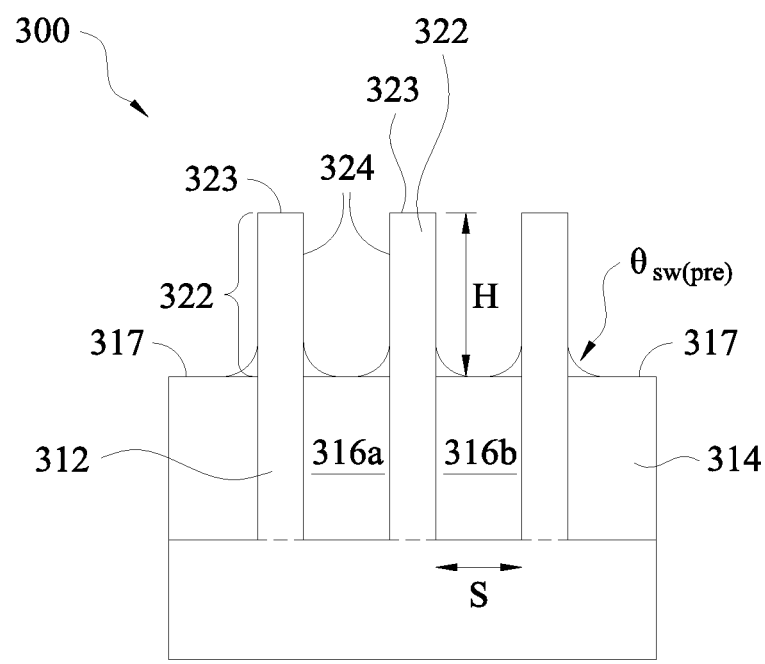
Figure 7C:
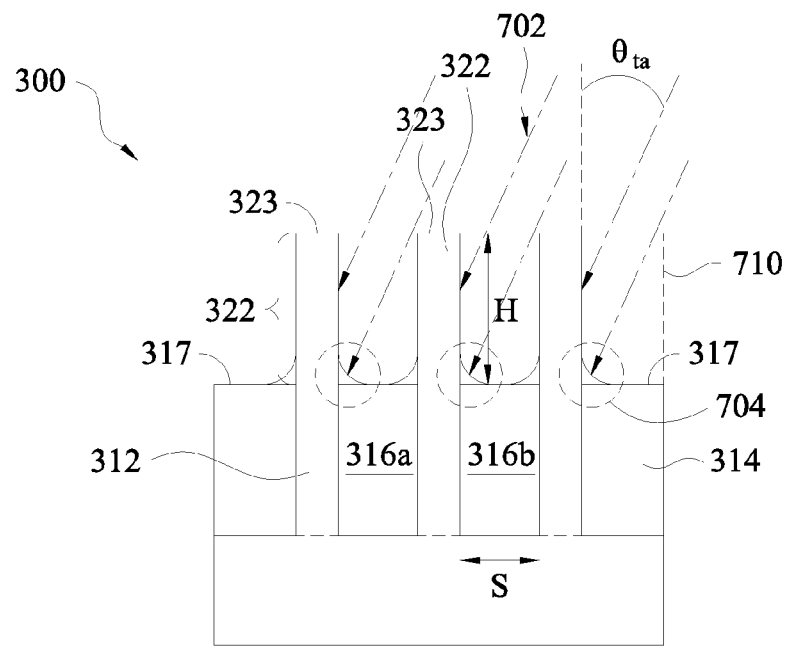
Figure 7D:
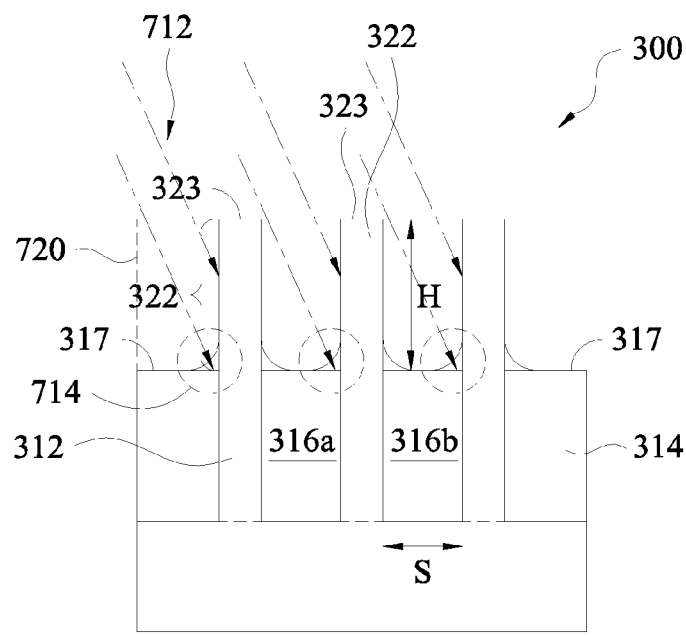

The present disclosure provides a method of fabricating a FinFET device using a tilt implantation in the formation of an STI region in the FinFET device such that the effects from the concave surface profile are decreased thereby improving performance of the FinFET device (see, FIGS. 7C and 7D). For example, physical dimensions of corner portions at the top surface of the isolation insulating layer 150 can be decreased to minimize the concave surface profile. In addition, the tilt implantation can be performed to reduce the concave surface profile prior to the epitaxial growth in the FinFET device (see FIGS. 9B and 10B). Increases in the active region and shape of the epitaxial growth can cause the drive current in the FinFET device to increase thereby improving the performance of the FinFET device.

Figure 2:
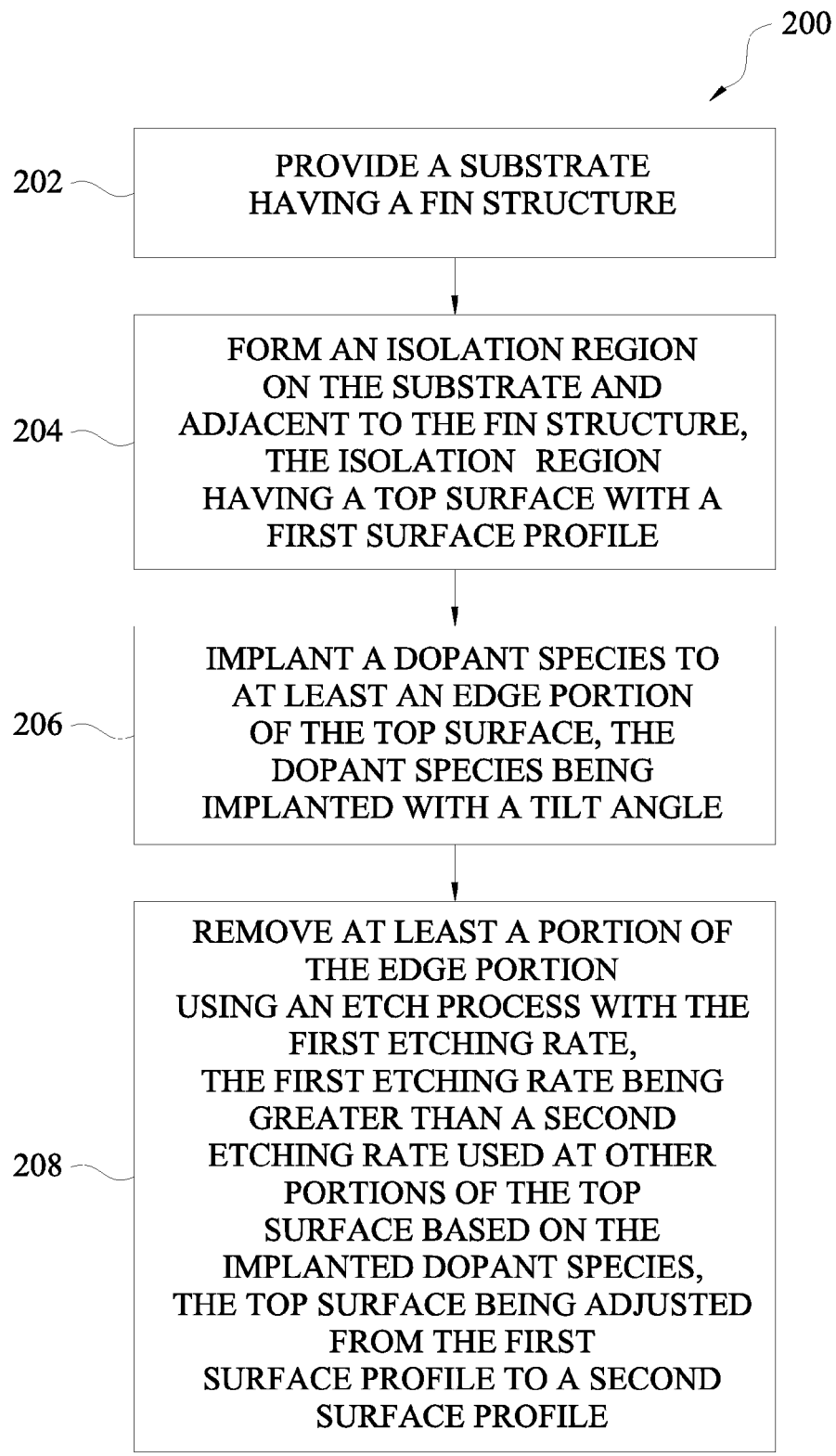
FIG. 2 illustrates a flow chart of an exemplary process to reduce a concave surface profile in a FinFET device in accordance with some embodiments of the present disclosure.
Figure 3A:
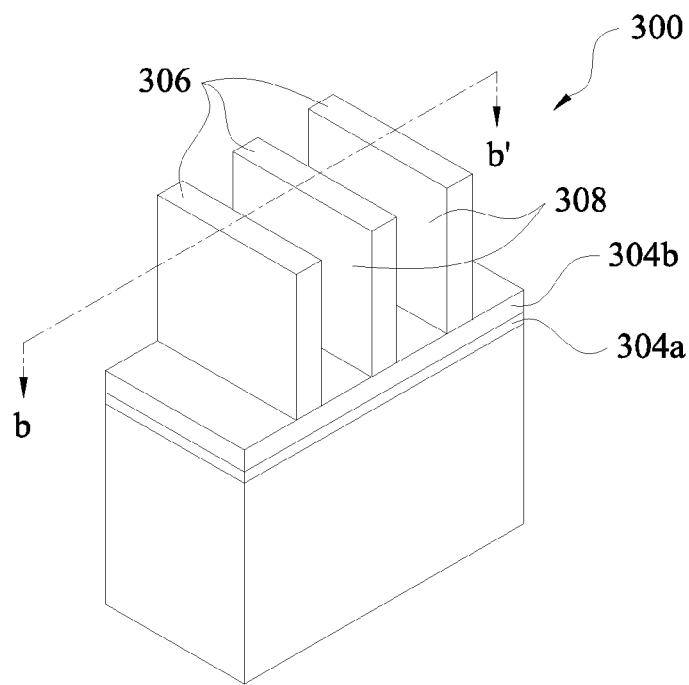
FIGS. 3A-6B illustrate examples of cross-sectional views of intermediate stages in the fabrication of a FinFET structure in accordance with some embodiments of the present disclosure.
Figure 3B:
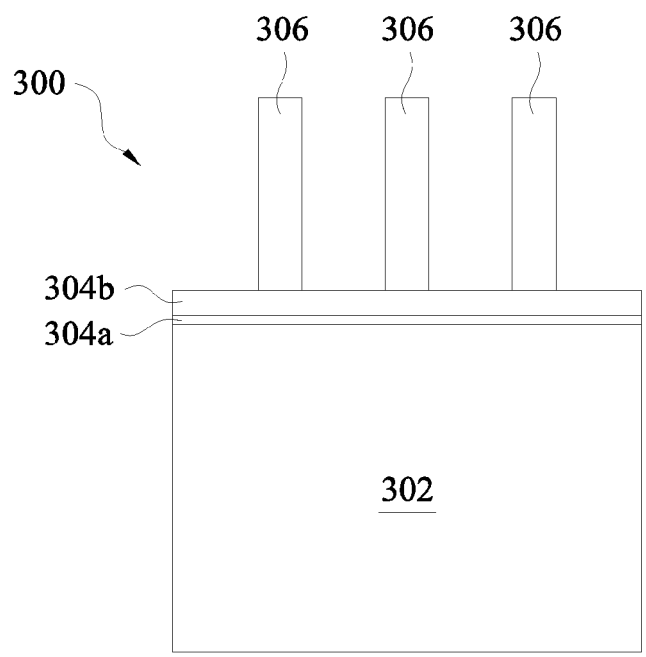

FIG. 2 illustrates a flow chart of an exemplary process 200 to reduce a concave surface profile in a FinFET device. For explanatory purposes, the example process 200 is described herein with reference to the FinFET device 100 of FIG. 1; however, the example process 200 is not limited to the FinFET device 100 of FIG. 1, and the example process 200 may be performed in other similar semiconductor devices. Further for explanatory purposes, the blocks of the example process 200 are described herein as occurring in serial, or linearly. However, multiple blocks of the example process 200 may occur in parallel. In addition, the blocks of the example process 200 need not be performed in the order shown and/or one or more of the blocks of the example process 200 need not be performed.

In step 202, a substrate having a fin structure is provided. In step 204, an isolation region is formed on the substrate and adjacent to the fin structure. The isolation region can have a top surface with a first surface profile. The fin structure can have an active region above the top surface of the isolation region.

In step 206, a dopant species is implanted to at least an edge portion of the top surface of the isolation region that is adjacent to a sidewall surface of the fin structure. The dopant species may be implanted with a tilt angle relative to the sidewall surface of the fin structure. The tilt angle can be non-perpendicular to the top surface.

In the implanting of the dopant species, a tilt angle may be determined to be in a range of about +1 degrees to about +60 degrees based on a fin height dimension of the fin structure and a fin pitch dimension between the fin structure and an adjacent fin structure. The implanting of the dopant species can include determining the dopant species having at least one of an n-type species, a p-type species or a non-biasing material. The implanting of the dopant species can include determining implant energy in a range of about 0.1 KeV to about 500 KeV, in which the dopant species is implanted with the determined implant energy. The implanting of the dopant species can include determining an implant dose in a range of about $1\times10^{12}$ atoms/cm$^2$ to about $1\times10^{15}$ atoms/cm$^2$, in which the dopant species is implanted with the determined implant dose.

In step 208, at least a portion of the edge portion is removed using an etch process with a first etching rate. The first etching rate can be greater than a second etching rate used at other portions of the top surface based on the implanted dopant species. The top surface may be adjusted from the first surface profile to a second surface profile based on the increased etching rate. The second surface profile may have a step height that is smaller than a step height corresponding to the first surface profile. In this example, the step height may be reduced such that the sidewall angle of the edge portions at the top surface is less than +45 degrees.

The top surface of the isolation region is recessed by the etch process to form a sidewall angle in a range of about +45 degrees to about −15 degrees. The sidewall angle is defined between a surface of the edge portion at the top surface of the isolation region and an axis parallel to a surface of the substrate.

FIGS. 3-10 illustrate examples of cross-sectional views of intermediate stages in the fabrication of a FinFET device 300 in accordance with some embodiments of the present disclosure. FIG. 3A is a perspective view of the FinFET device 300 having a substrate 302 at one of various stages of fabrication according to an embodiment of the present disclosure, and FIG. 3B is a cross-sectional view of the FinFET device 300 taken along the line b-b' of FIG. 3A.

In one embodiment, the substrate 302 includes a crystalline silicon substrate (e.g., wafer). A p-type substrate or n-type substrate may be used and the substrate 302 may include various doped regions, depending on design requirements. In some embodiments, the doped regions may be doped with p-type or n-type dopants. For example, the doped regions may be doped with p-type dopants, such as boron or BF$_2$; n-type dopants, such as phosphorus or arsenic; and/or combinations thereof. The doped regions may be configured for an n-type FinFET, or alternatively configured for a p-type FinFET.

In some alternative embodiments, the substrate 302 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Also alternatively, the substrate may include an epitaxial layer. For example, the substrate may have an epitaxial layer overlying a bulk semiconductor. Further, the substrate may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrates may be formed by selective epitaxial growth (SEG). Furthermore, the substrate may include a semiconductor-on-insulator (SOI) structure. Also alternatively, the substrate may include a buried dielectric layer, such as a buried oxide (BOX) layer, such as that formed by separation by implantation of oxygen (SIMOX) technology, wafer bonding, SEG, or other appropriate process.

In one embodiment, a pad layer 304a and a mask layer 304b are formed on the semiconductor substrate 302. The pad layer 304a may be a thin film having silicon oxide formed, for example, using a thermal oxidation process. The pad layer 304a may act as an adhesion layer between the semiconductor substrate 302 and the mask layer 304b. The pad layer 304a may also act as an etch stop layer for etching the mask layer 304b. In at least one embodiment, the mask layer 304b is formed of silicon nitride, for example, using low-pressure chemical vapor deposition (LPCVD) or plasma enhanced chemical vapor deposition (PECVD). The mask layer 304b is used as a hard mask during subsequent patterning processes. A photoresist layer 306 is formed on the mask layer 304b and is then patterned by a photolithography patterning process, forming openings 308 in the photoresist layer 306.

The photolithography patterning process may include photoresist coating (e.g., spin-on coating), soft baking, mask aligning, exposing, post-exposure baking, developing a photoresist, rinsing, drying (e.g., hard baking), other suitable processes, or combinations thereof. Alternatively, the photolithography patterning process is implemented or replaced by other proper methods such as maskless photolithography, electron-beam writing, direct-writing, and/or ion-beam writing. The photolithography patterning process yields the photoresist layer that is used as a mask during a trench etching process.

Figure 4A:
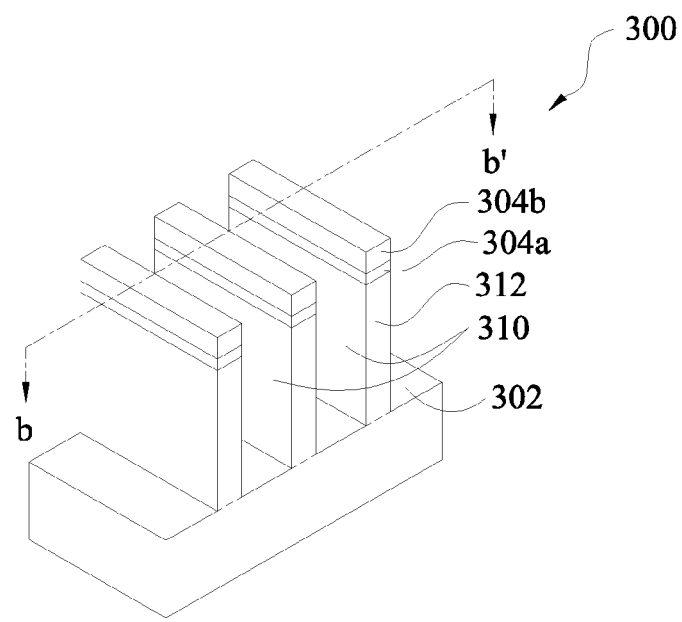
Figure 4B:
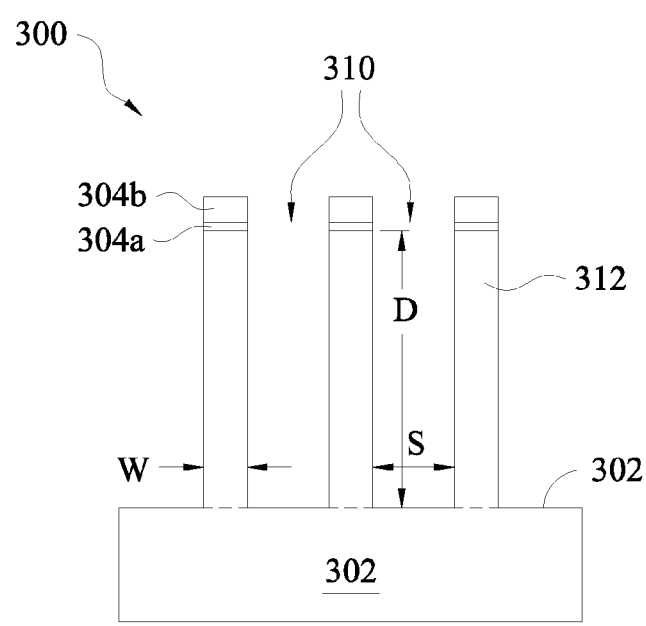

FIG. 4A is a perspective view of the FinFET device 300 at one of various stages of fabrication according to an embodiment of the present disclosure, and FIG. 4B is a cross-sectional view of the FinFET device 300 taken along the line b-b' of FIG. 4A. The mask layer 304b and pad layer 304a are etched through openings 308 to expose underlying semiconductor substrate 302. The exposed semiconductor substrate 302 is then trench-etched to form trenches 310 by using the patterned mask layer 304b and pad layer 304a as a mask.

In the trench etching process, the substrate 302 may be etched by various methods, including a dry etch, a wet etch, or a combination of dry etch and wet etch. The dry etching process may implement fluorine-containing gas (e.g., $CF_4$, $SF_6$, $CH_2F_2$, $CHF_3$, and/or $C_4F_8$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof.

Portions of the semiconductor substrate 302 between trenches 310 form semiconductor fins 312. The fins 312 may be arranged in strips (viewed from in the top of the FinFET device 300) parallel to each other, and closely spaced with respect to each other. Each of the fins 312 has a width W and a depth D, and are spaced apart from an adjacent fin by a width S of the trench 310. For example, the width W of the semiconductor fin 312 may be in a range of about 3 nm to about 30 nm. The photoresist layer 306 is then removed. The photoresist layer may be removed after patterning of the mask layer 304b and pad layer 304a and before the trench etching. Next, a wet cleaning operation may be performed to remove a native oxide of the semiconductor substrate 302. The cleaning may be performed using dilute hydrofluoric (DHF) acid.

Figure 5A:
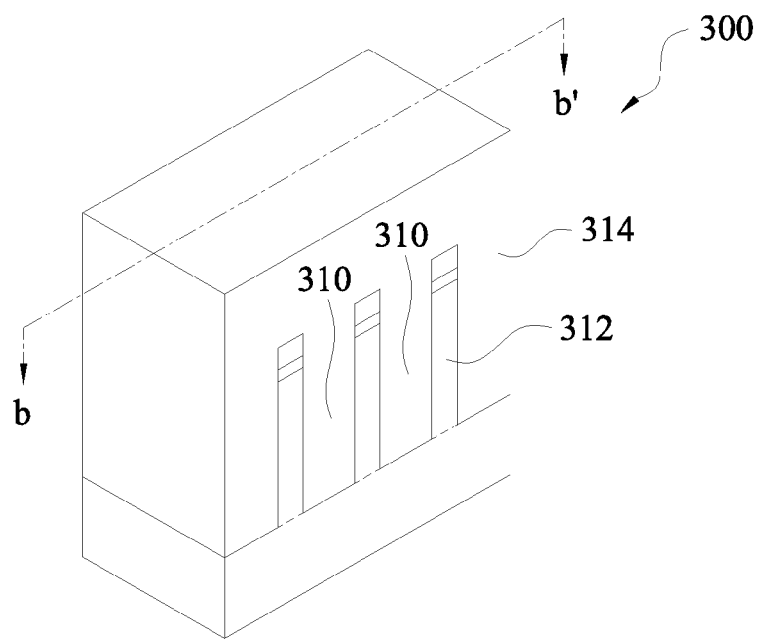
Figure 5B:
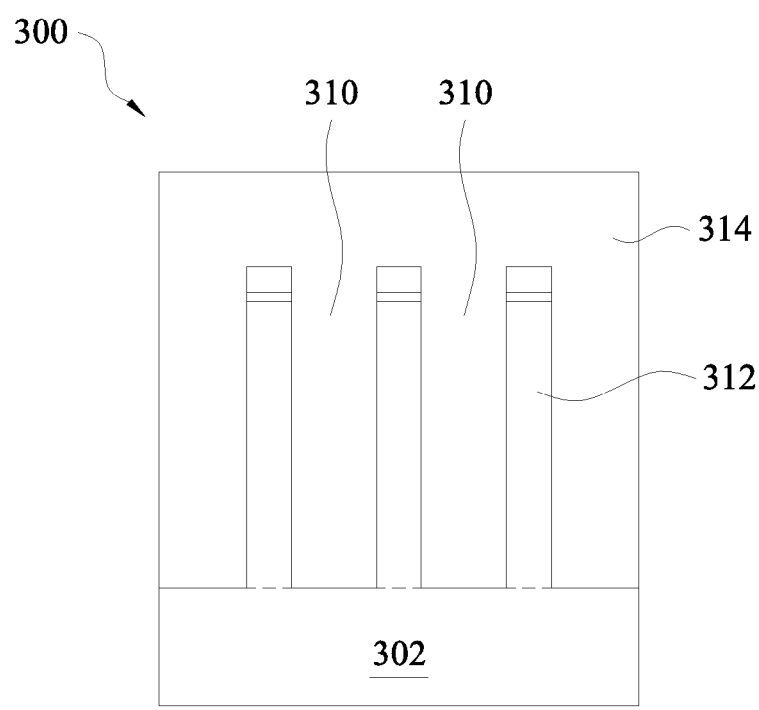

FIG. 5A is a perspective view of the FinFET device 300 at one of various stages of fabrication according to an embodiment of the present disclosure, and FIG. 5B is a cross-sectional view of the FinFET device 300 taken along the line b-b' of FIG. 5A. Trenches 310 are filled with a dielectric material 314. The dielectric material 314 may include silicon oxide. In one or more implementations, the dielectric material 314 is made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once at temperatures, such as in a range from about 1000° C. to about 1200° C., and for an extended period, such as 30 hours or more in total.

In some embodiments, other dielectric materials, such as silicon nitride, silicon oxynitride, fluoride-doped silicate glass (FSG), or a low-K dielectric material, may also be used to form the dielectric material 314. In an embodiment, the dielectric material 314 is formed using a high-density-plasma (HDP) CVD process, using silane ($SiH_4$) and oxygen ($O_2$) as reacting precursors. In other embodiments, the dielectric material 314 may be formed using a sub-atmospheric CVD (SACVD) process or high aspect-ratio process (HARP), in which process gases may include tetraethylorthosilicate (TEOS) and/or ozone (O3). In yet other embodiments, the dielectric material 314 may be formed using a spin-on-dielectric (SOD) process, such as hydrogen silsesquioxane (HSQ) or methyl silsesquioxane (MSQ). In some embodiments, the filled recess region (or the trenches 310) may have a multi-layer structure such as a thermal oxide liner layer filled with silicon nitride or silicon oxide.

Figure 6A:
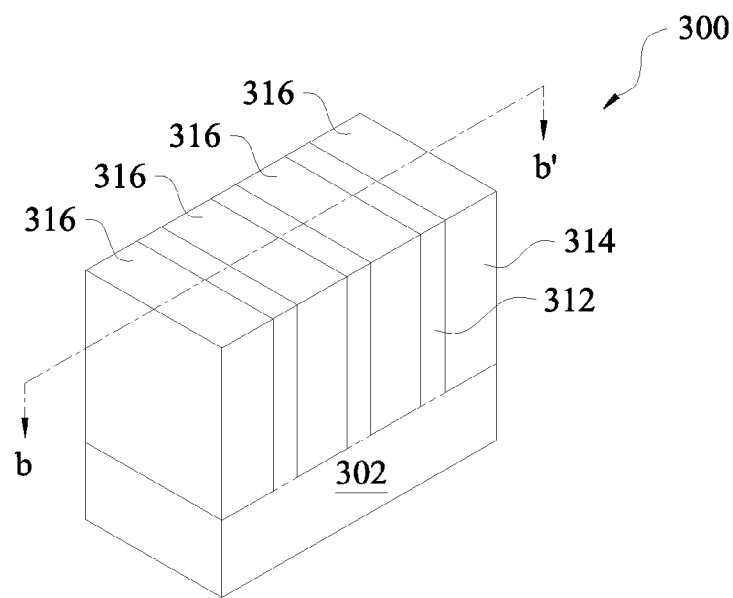
Figure 6B:
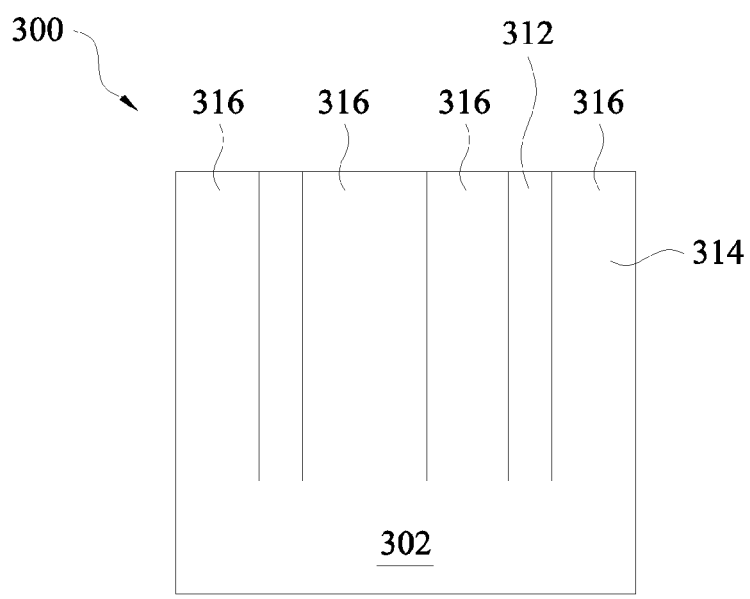

FIG. 6A is a perspective view of the FinFET device 300 at one of various stages of fabrication according to an embodiment of the present disclosure, and FIG. 6B is a cross-sectional view of the FinFET device 300 taken along the line b-b' of FIG. 6A. After the deposition of the dielectric material 314, a chemical mechanical polish (CMP) and/or an etch-back process are then performed, followed by the removal of the mask layer 304b and pad layer 304a. An annealing process may be performed after the trenches 310 are filled with the dielectric material 314. The annealing process includes rapid thermal annealing (RTA), laser annealing processes, or other suitable annealing processes.

In at least one embodiment, the mask layer 304b is formed of silicon nitride such that the mask layer 304b may be removed using a wet process using $H_3PO_4$. The pad layer 304a may be removed using dilute HF acid, if the pad layer 304a is formed of silicon oxide. The remaining portions of the dielectric material 314 in the trenches 310 are hereinafter referred to as isolation regions 316. In some embodiments, the removal of the mask layer 304b and the pad layer 304a is performed after the recessing of the isolation regions 316, which recessing step is shown in FIGS. 7A and 7B.

FIG. 7A is a perspective view of the FinFET device 300 at one of various stages of fabrication according to an embodiment of the present disclosure, and FIG. 7B is a cross-sectional view of the FinFET device 300 taken along the line b-b' of FIG. 7A. FIGS. 7C and 7D illustrate cross-sectional views of an example tilt implantation on the FinFET device 300. An etching process may be performed to etch isolation regions 316 to expose the upper portions of the semiconductor fins 312 from the isolation regions 316.

The etching process may include a dry etching process, wet etching process, or combination dry and wet etching processes to remove portions of the isolation regions 316. In the present embodiment, the etching process includes a wet etching process. It is understood that the etching process may be performed as one etching process or multiple etching processes.

The remaining isolation regions 316 include a first isolation region 316a and second isolation region 316b, and top surfaces 317. Further, the upper portions 322 of the semiconductor fins 312 protruding over the top surfaces 317 of the remaining isolation regions 316 thus are used to form an active area, such as a channel region, of the FinFET device 300. The upper portions 322 of the semiconductor fins 312 may include top surfaces 323 and sidewalls 324. Height H of the upper portions 322 of the semiconductor fins 312 from the top surface 317 of the isolation regions 316 may be in a range of about 6 nm to about 300 nm. In some embodiments, the height H is greater than 300 nm or smaller than 6 nm. For simplicity, the upper portion 322 of the semiconductor fin 312 between the first isolation region 316a and the second isolation region 316b is hereinafter referred to as the channel fin to illustrate each upper portion of the semiconductor fin 312, in which the top surfaces 317 of the first isolation region 316a and the second isolation region 316b are lower than the top surface 323 of the semiconductor fin 312.

After the height of the isolation regions 316 is reduced, a tilt implantation is performed as shown in FIG. 7C. As shown in FIG. 7B, concave surface profiles may be present at the first isolation region 316a and the second isolation region 316b sandwiched by two fins. The concave surface profile may cause a decrease in surface area of an active region of a fin structure, which adversely impacts the drive current during on/off operational states of a FinFET device thereby affecting the performance of a respective integrated circuit. In this example, the concave surface profiles have a sidewall angle (e.g., $\theta_{sw(pre)}$) that is greater than +45 degrees at the corner edges of the isolation regions 316a, 316b.

Referring to FIG. 7C, the tilt implantation of ions is performed on the top surface 317 of isolation regions 316 to modify a part of the dielectric material 314 such that the part of the dielectric material 314 can be etched with a higher etching rate by a following etching process. When ions are implanted to a dielectric material, the portion into which the ions are implanted is etched at a higher etching rate than a portion where no ions are implanted. For example, the dielectric material 314 without the ion implantation can be etched at a first etch rate whereas the dielectric material 314 implanted with the dopant species (ions) can be etched at a second etch rate that is greater than the first etch rate. In this example, the tilt implantation may be performed to implant dopants (e.g., implant ions 702) substantially only to the edge portions of the isolation regions 316 depicted as implant regions 704 such that the etch rate in the following etching process increases substantially only at the edge portions. As a result, after the etching process, a substantially flat step height surface profile of the first and second isolation regions may be formed.

The implantation process may utilize p-type dopants (e.g., B or In) for the PMOS devices and n-type dopants (P or As) for the NMOS devices. For example, the tilt implantation involves implantation of an n-type dopant (e.g., Arsenic-containing ions, Phosphorus-containing ions), a p-type dopant (e.g., Boron-containing ions) or a neutral type dopant (e.g., Argon-containing atoms, Flourine-containing atoms) to implant regions 704 (e.g., an edge portion of the top surfaces 317 in the isolation regions 316a and 316b). In some aspects, the tilt implantation implants the dopant species using implant energy in a range of about 0.1 KeV to about 500 KeV with an implant dosage in a range of about $1\times10^{12}$ atoms/cm$^2$ to about $1\times10^{15}$ atoms/cm$^2$. In other embodiments, the acceleration voltage is in a range of about 10 KeV to about 100 KeV. The dosage may be in a range of about $1\times10^{13}$ atoms/cm$^2$ to about $1\times10^{14}$ atoms/cm$^2$ in some embodiments. In one or more implementations, ions are also implanted into the sidewalls of the channel region of the semiconductor fin 312. By adjusting the tilt implantation conditions, it is possible to control the etching rate of the isolation regions at the corners, thereby adjusting the sidewall angle $\theta_{sw}$ at the corner edges of the isolation regions 316a, 316b.

The implantation process may be performed with a tilt angle (e.g., $\theta_{ta}$) in a range of about +1 degree to about +60 degrees to yield a sidewall angle (e.g., $\theta_{sw}$) at the corner edges of the isolation regions 316a, 316b in a range of about +45 degrees to about −15 degrees after the subsequent etch process. The sidewall angle $\theta_{sw}$ may be defined as the angle between a surface of the edge portion at the top surface 317 of the isolation region 316 and an axis parallel to the top surface 317 toward the sidewall surface of the semiconductor fin 312. In this example, the positive sidewall angle represents a surface profile at the top surface that is protruding in an upward direction from a near edge portion the top surface toward the sidewall surface of the semiconductor fin 312. In another example, a sidewall angle of 0 degrees represents a surface profile that is substantially flat. In yet another example, the negative sidewall angle represents a surface profile at the top surface that is receding in a downward direction from the near edge portion of the top surface toward the sidewall surface. By changing the tilt angle, the area of the top surface into which the ions are implanted can be changed.

In addition, the ions can be implanted from two directions (e.g., 0 degrees and 180 degrees by rotating the wafer). In FIG. 7C, the tilt implantation is implanted from a first direction (e.g., 0 degrees of a wafer rotation). In FIG. 7D, the tilt implantation is implanted from a second direction (e.g., 180 degrees). In this example, the tilt implantation may be performed to implant dopants (e.g., implant ions 712) only to the edge portions of the isolation regions 316 depicted as implant regions 714. In one or more implementations, the tilt implantation is performed four times (e.g., 0, 90, 180 and 270 degree rotations), since there may be fins extending in two directions substantially perpendicular to each other.

In some aspects, the tilt angle is determined on fin dimensions of fin structures 312, and a fin pitch dimension between the fin structures 312. For example, the tilt angle can be defined $\theta_{ta}$=arctan (S/H)−Δθ, where H is the height of the active region of a fin, S is the distance between two adjacent fins, and Δθ is a predetermined offset depending on implementation. The Δθ may be in a range of about −1 degrees to about +10 degrees in some embodiments, in a range of about 0 degrees to about +7 degrees in other embodiments, and in a range of about 1 degree to about +5 degrees in certain embodiments. In this example, the height (H) of the semiconductor fin 312 may be in a range of about 3 nm to about 300 nm while the fin distance (S) may be in a range of about 6 nm to about 600 nm.

Following the tilt implantation, an etching process, for example, a wet etching process may be performed. In this example, the top surface 317 is recessed by the wet etching process to yield a sidewall angle $\theta_{sw}$ in a range of about +45 degrees to about −15 degrees depending on the tilt angle and implant characteristics (e.g., voltage, dosage). It has been observed that responsive to the tilt implantation, the associated etch rate increases proportionate to the amount of dopant and/or acceleration voltages. As such, the step height of the isolation region 316 becomes substantially flat ($\theta_{sw}\approx 0$ degrees) based on the increased etch rate at the edge portions thereby increasing the surface area of the active regions in the fin structures 312.

In one or more implementations, dummy fins are formed on opposite ends of the top surface 317 to provide uniformity in the patterning and/or etching. Ions may be entirely implanted into the top surface of the isolation regions 316 at the left side (or right side) of the fin structures 312 if there are no other fins. In FIG. 7C, dummy fin 710 is formed adjacent to one of the fins 312 and protruding over the top surface 317 of the isolation region 316. In this example, ions can be implanted into implant regions 704 to thereby have an etch rate in the following etching process be increased for substantially only the edge portions corresponding to the implant regions 704. In FIG. 7D, dummy fin 720 is formed adjacent to one of the fins 312 and protruding over the top surface 317 of the isolation region 316. In this example, ions can be implanted into implant regions 714 to thereby have an etch rate in the following etching process increased at substantially only the edge portions corresponding to the implant regions 714.

The substantially flat step height in the isolation region can result from the edge portion having an etch rate that is higher than the etch rate of neighboring portions of the top surface. The substantially flat step height enables an increase in the surface area of the fin active region to be realized. As such, a larger active area for the fin structure can provide a higher drive current for the FinFET structure thereby improving performance of the FinFET structure.

Figure 8A:
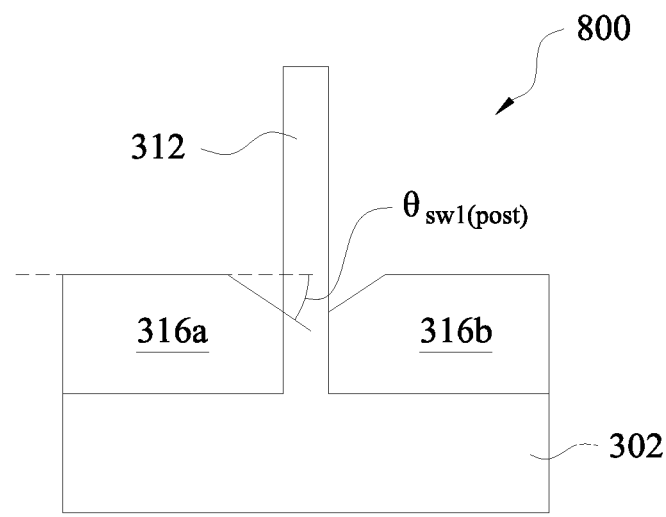
FIGS. 8A-8C illustrate examples of surface profiles for isolation regions in the FinFET structure in accordance with some embodiments of the present disclosure.
Figure 8B:
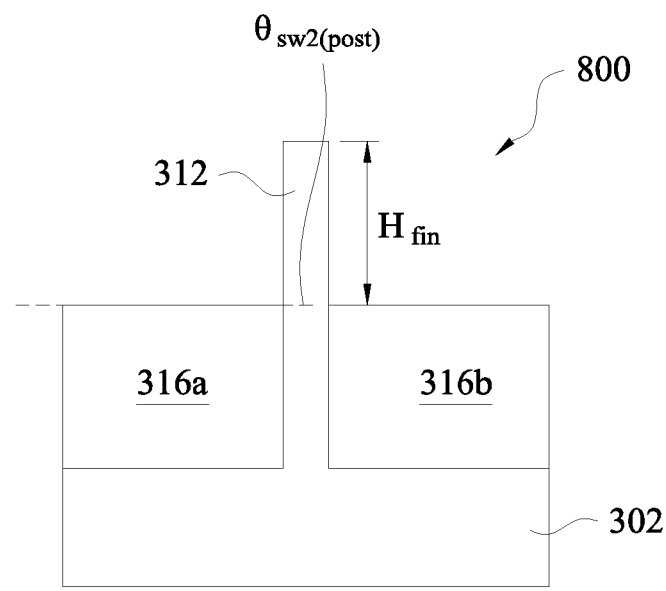
Figure 8C:
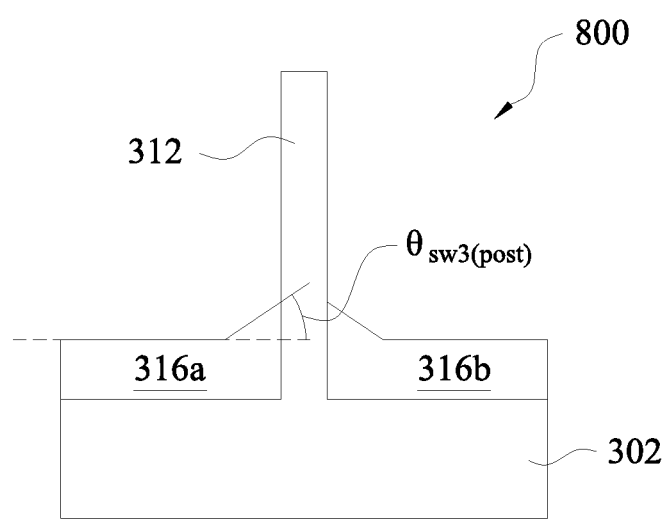

FIGS. 8A-8C illustrate examples of surface profiles for shallow trench isolation regions in a FinFET structure 800 in accordance with some embodiments of the present disclosure. As shown in FIGS. 8A, 8B, and 8C, STI regions 316a and 316b are recessed by an etching process. Substrate 302 has a semiconductor strip adjacent to STI regions 316a and 316b. The upper portion of the semiconductor strip protruding over top surfaces of the remaining STI regions 316a and 316b thus becomes semiconductor fin 312.

In order to form the STI regions 316 having the surface profiles as shown in FIGS. 8A-8C, a wet etch may be performed. In an embodiment, the wet etch is performed subsequent to a tilt implantation described in FIGS. 7C and 7D. The tilt implantation implants ions (e.g., n-type, p-type species or neutral species) to an edge (or corner) of the top surface of the STI regions 316a and 316b such that an etching rate in the wet etch increases at the edge portions of the dielectric material in the STI regions 316a and 316b, compared with the center portions in the STI regions 316a and 316b.

Prior to the tilt implantation, the dielectric material may be etched at a first etch rate in an etching process. However, following the implantation, the dielectric material is modified such that the dielectric material is etched at a second etch rate that is greater than the first etch rate. Because the ions are implanted substantially only to the edge portion by the tilt implantation, the etch rate substantially only at the edge portion increases. Accordingly, the vertical etching along sidewalls of the fin structure 304 can be accelerated relative to center portions of the top surface, and flat or convex surface profiles in the STI regions 316a and 316b may be formed.

In FIG. 8A, the surface profile corresponds to a first sidewall angle $\theta_{sw1(post)}$ that is in a range of 0 degrees to −15 degrees (or +345 degrees). In this example, the first sidewall angle $\theta_{sw1(post)}$ is approximately −5 degrees. In FIG. 8B, the surface profile corresponds to a second sidewall angle $\theta_{sw2(post)}$ that is approximately 0 degrees. The height (e.g., $H_{fin}$) of the semiconductor fin 312 may be in a range of about 30 nm to about 300 nm, and the pitch of the fin structure 304 with respect to an adjacent fin structure (not shown) may be in a range of about 3 nm to about 30 nm, although the ranges may vary depending on implementation. In FIG. 8C, the surface profile corresponds to a third sidewall angle $\theta_{sw3\ (post)}$ that is in a range of about 0 degrees to about +45 degrees (e.g., $\theta_{sw} \approx +45$ degrees). Etching the top surfaces of STI regions 316a and 316b to yield a substantially flat step height can minimize the effects of the concave surface profile. As such, the surface profiles of the STI regions 316a and 316b can yield an active region and/or an epitaxial growth shape that improves performance of the FinFET structure.

Figure 9A:
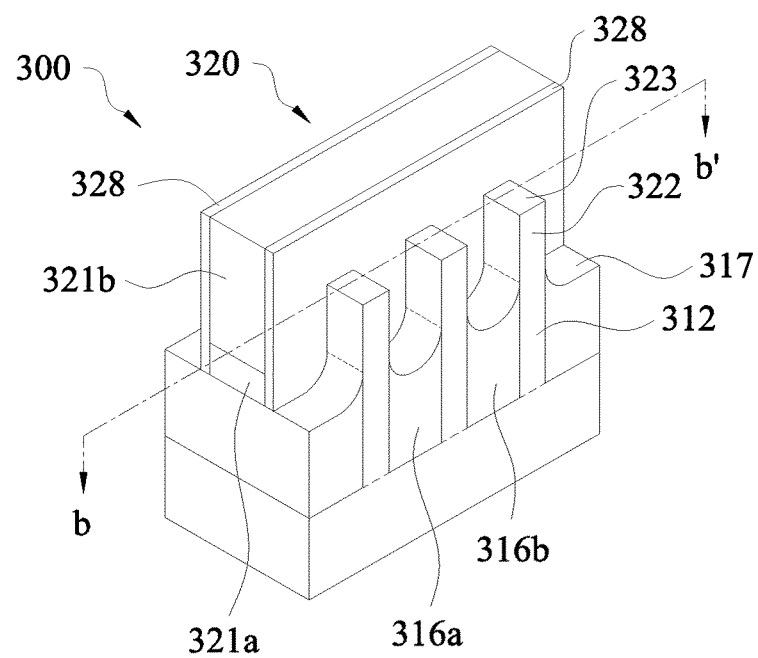
FIGS. 9A-10B illustrate examples of cross-sectional views of another intermediate stage in the fabrication of a FinFET structure including an exemplary tilt implantation before and after fin recess in accordance with some embodiments of the present disclosure.
Figure 9B:
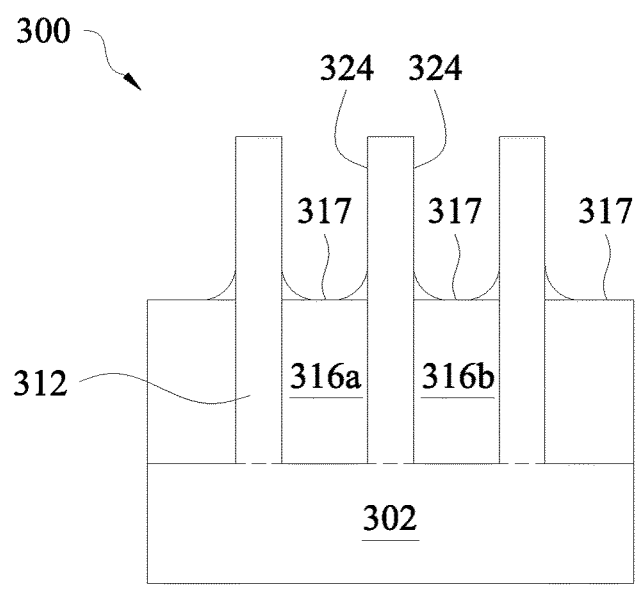

FIG. 9A is a perspective view of the FinFET device 300 at one of various stages of fabrication according to an embodiment of the subject technology, and FIG. 9B is a cross-sectional view of the FinFET device 300 taken along the line b-b' of FIG. 9A. A gate stack 320 is formed over the substrate 302 over the top surface 323 and sidewalls 324 of the semiconductor fin 312, and extending to the top surfaces 317 of the first isolation region 316a and the second isolation region 316b. The gate stack 320 includes a gate dielectric layer 321a and a gate electrode layer 321b over the gate dielectric layer 321a.

In FIG. 9A, the gate dielectric 321a is formed to cover the top surface 323 and sidewalls 324 of at least a portion of the channel region of the semiconductor fins 312. In some embodiments, the gate dielectric layer 321a includes silicon oxide, silicon nitride, silicon oxy-nitride, or high-k dielectrics. High-k dielectrics may include metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The gate dielectric layer 321a may be formed using a suitable process such as atomic layer deposition (ALD), chemical vapor deposition (CVD), physical vapor deposition (PVD), thermal oxidation, UV-ozone oxidation, or combinations thereof. The gate dielectric layer 321a may further include an interfacial layer (not shown) to reduce damage between the gate dielectric layer 321a and the fin 312. The interfacial layer may include silicon oxide.

The gate electrode layer 321b is then formed on the gate dielectric layer 321a. In at least one embodiment, the gate electrode layer 321b covers the upper portion 322 of more than one semiconductor fin 312, so that the resulting FinFET device 300 includes more than one fin structure. In some alternative embodiments, each of the upper portions 322 of the semiconductor fins 312 may be used to form a separate FinFET device 300. The gate electrode layer 321b may include a single layer or a multilayer structure. The gate electrode layer 321b may include poly-silicon. Further, the gate electrode layer 321b may be doped poly-silicon with the uniform or non-uniform doping. In some alternative embodiments, the gate electrode layer 321b may include a metal such as Al, Cu, W, Ti, Ta, TiN, TiAl, TiAlN, TaN, NiSi, CoSi, other conductive materials with a work function compatible with the substrate material, or combinations thereof. The gate electrode layer 321b may be formed using a suitable process such as ALD, CVD, PVD, plating, or combinations thereof.

Still referring to FIG. 9A, the FinFET device 300 also includes sidewall spacers 328 made of a dielectric layer formed along the side of the gate stack 320. In some embodiments, the dielectric layer includes silicon oxide, silicon nitride, silicon oxy-nitride, or other suitable material. The dielectric layer may include a single layer or multilayer structure. A blanket layer of the dielectric layer may be formed by CVD, PVD, ALD, or other suitable technique. Then, an anisotropic etching and/or etch-back process is performed on the dielectric layer to form a pair of sidewall spacers 328 on two sides of the gate stack 320.

During the formation of the gate stack 320, various cleaning/etching processes, which etch the STI regions 316 and 316b, are performed. As a result, as shown in FIG. 9B, a concave surface profile having the sidewall angle $\theta_{sw}$ greater than +45 degrees may be present between the top surfaces 317 and the sidewalls 324 of the semiconductor fins 312. The tilt implantation can also be performed to provide a substantially flat step height of the isolation regions 316 prior to the recess process of the semiconductor fin 312. For example, the tilt implantation is performed as shown in FIGS. 7C and 7D. In order to form the STI regions 316 having the surface profiles as shown in FIGS. 8A-8C, a wet etch is performed subsequent to the tilt implantation.

Figure 10A:
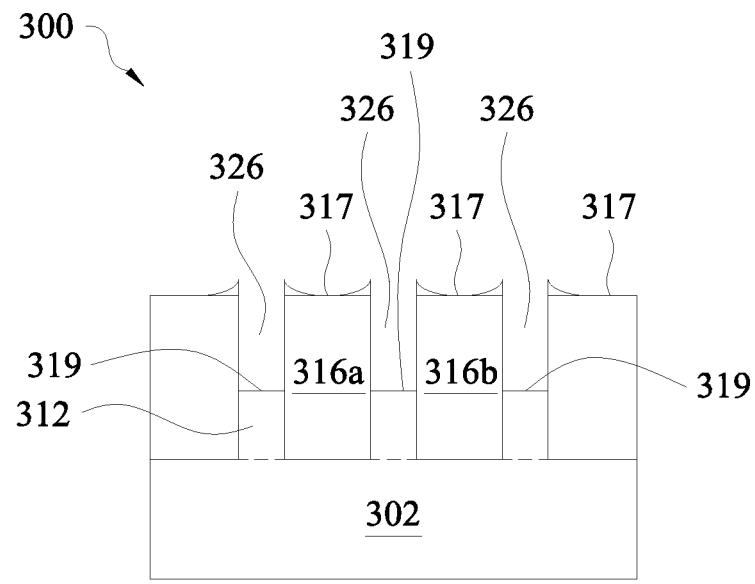

FIG. 10A is a cross-sectional view of the FinFET device 300. The portion of the semiconductor fin 312 not covered by the gate stack 320 (FIG. 9A) and spacers 328 (FIG. 9A) formed thereover are recessed to form a recessed portion 326 of the semiconductor fin 312 having a top surface 319 below the flat top surfaces 317 of the first and second isolation regions 316a, 316b. In one embodiment, using the pair of spacers 328 as hard masks, a biased etching process is performed to recess top surface 319 of the channel fin 322a that are unprotected or exposed to form the recessed portion 326 of the semiconductor fin 312. In an embodiment, the etching process may be performed using HBr and/or $Cl_2$ as etch gases.

Referring to FIG. 10A, if the concave surface profile having the sidewall angle $\theta_{sw}$ 0.5~+45 degrees remains, for example, after recessing the semiconductor fins 312 to form recesses for epitaxial source/drain, there would be a sharp spike at the edge portions of the top surfaces 317. As such, the tilt implantation may be performed to allow better control of an etching direction to achieve desired profiles for a recessed portion of a semiconductor fin while minimizing the smiling effects. In this respect, the surface area around the recessed fin would not be constrained, thus allowing the epitaxial S/D to be formed on the recessed portion of the fin without constrain. Based on the tilt implantation and clean process performed prior to the recess of or after the recess of the semiconductor fin 312, the top surface 317 can yield a substantially flat surface (e.g., sidewall angle $\theta_{sw}$ is approximately 0 degrees) before epitaxial growth.

Figure 10B:
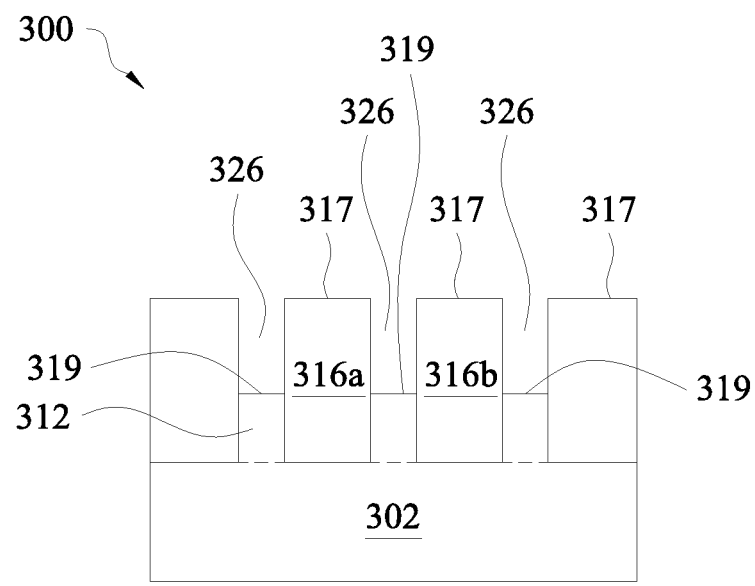

Referring to FIG. 10B, the tilt implantation is performed after the recess of semiconductor fins 312 to provide a substantially flat step height of the isolation regions 316. In this respect, the surface area above the recessed fin would not be constrained, thus allowing the epitaxial S/D to be formed on the recessed portion of the fin without constrain. The tilt implantation may be performed before and/or after recessing the semiconductor fins 312.

Figure 11A:
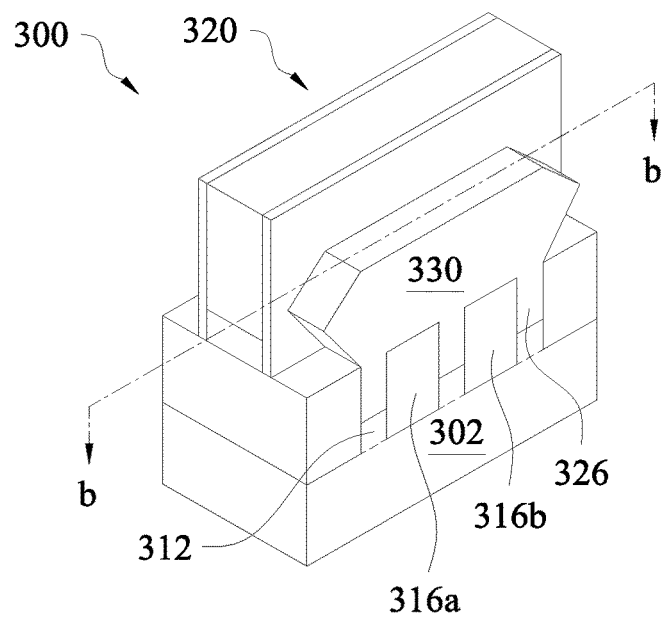
FIGS. 11A and 11B illustrate examples of cross-sectional views of an intermediate stage involving epitaxial growth in the fabrication of a FinFET structure in accordance with some embodiments of the present disclosure.
Figure 11B:
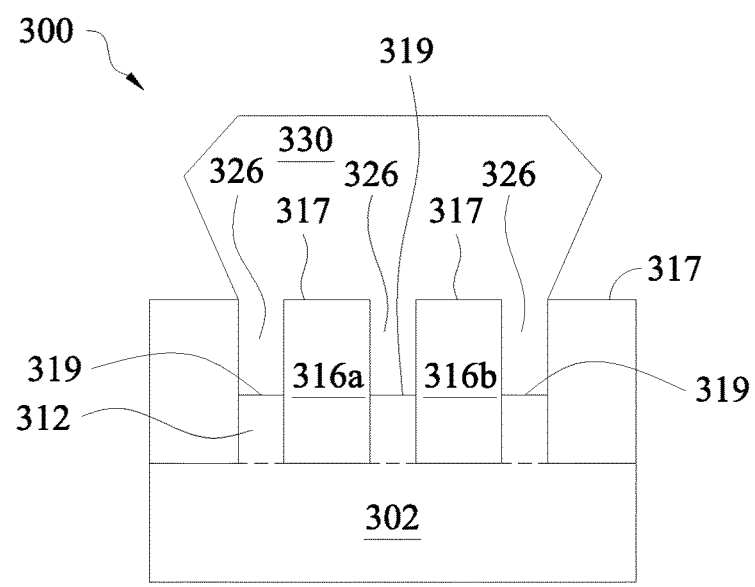

FIG. 11A is a perspective view of the FinFET device 300 at one of various stages of fabrication according to an embodiment of the present disclosure, and FIG. 11B is a cross-sectional view of the FinFET device 300 taken along the line b-b' of FIG. 11A. The structures depicted in FIGS. 11A and 11B are produced by selectively growing a strained material 330 over the recessed portion 326 of the semiconductor fin 312 and extending over the top surfaces 317 of the first and second isolation regions 316a, 316b. Since the lattice constant of the strained material 330 is different from the channel region of the semiconductor fin 312, the channel region of the semiconductor fin 312 is strained or stressed to enable carrier mobility of the device and enhance the device performance. Although the strained material 330 are connected in FIGS. 11A and 11B, the strained material 330 may be formed separately with respect to each fin.

In at least one embodiment, the strained material 330, such as silicon carbon (SiC) and/or silicon phosphide (SiP), is epitaxially grown by a LPCVD process to form the source and drain regions of an n-type FinFET. In at least another embodiment, the strained material 330, such as silicon germanium (SiGe), is epitaxially grown by a LPCVD process to form the source and drain regions of a p-type FinFET. The p-type FinFET and the n-type FinFET are separately formed. In this regard, an n-type epitaxial region or p-type epitaxial region can be defined using photolithography and etching processes. For example, a protective layer, such as a silicon nitride (SiN) layer, is formed to cover the p-type epitaxial region when the n-type epitaxial region is processed (e.g., S/D formation). Conversely, the SiN layer can cover the n-type epitaxial region when the p-type epitaxial region is processed.

The FinFET device 300 serves only as one example. The FinFET device 300 may be used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

In an embodiment, a method of fabricating a FinFET device includes providing a substrate having a fin structure. An isolation region can be formed on the substrate and adjacent to the fin structure. The isolation region can have a top surface with a first surface profile. The fin structure can have an active region above the top surface of the isolation region. A dopant species can be implanted to an edge of the top surface of the isolation region, which is adjacent to a sidewall surface of the fin structure. The dopant species can be implanted with a tilt angle relative to the sidewall surface of the fin structure. The tilt angle can be non-perpendicular to the top surface. At least a portion of the edge at the top surface of the isolation region can be removed using an etch process with a first etching rate. The first etching rate can be greater than a second etching rate used at other portions of the top surface based on the implanted dopant species. The top surface can be adjusted from the first surface profile to a second surface profile based on the increased etching rate. The second surface profile can have a step height that is smaller than a step height corresponding to the first surface profile. In this respect, the active region of the fin structure can be defined by the top surface of the isolation region having the second surface profile.

In another embodiment, a method of fabricating a FinFET device includes providing a substrate having a fin structure. An isolation region can be formed on the substrate and adjacent to the fin structure. The isolation region can have a top surface with a first surface profile that is below a top surface of the fin structure. A gate structure can be formed over at least a portion of the fin structure. Side wall spacers over side walls of the gate structure can be formed. After forming the side wall spacers, the isolation region can have a top surface with a first surface profile. A dopant species can be implanted to at least an edge portion of the top surface of the isolation region that is adjacent to a sidewall surface of the fin structure. The dopant species may be implanted with a tilt angle relative to the sidewall surface of the fin structure. As such, an etching rate at the edge portion of the top surface can be increased based on the implanted dopant species. At least a portion of the edge portion can be removed using a first etch process with the increased etching rate. The top surface can be adjusted from the first surface profile to a second surface profile based on the first etch process. The second surface profile can have a step height that is smaller than a step height corresponding to the first surface profile. In turn, at least a portion of the fin structure can be removed to recess the fin structure and form an epitaxial region. Thereafter, a semiconductor material can be formed by an epitaxy growth process in the epitaxial region.

In yet another embodiment, a semiconductor device includes a substrate including a first fin structure and a second fin structure. The semiconductor device can include an isolation region formed between the first fin structure and the second fin structure. The semiconductor device includes an isolation region formed between the first fin structure and the second fin structure. A top surface of the isolation region can have a sidewall angle at edge portions of the isolation region in a range of about +45 degrees to about −0.15 degrees. The sidewall angle can be defined between a sidewall surface of the fin structure and an axis parallel to the top surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a fin field-effect transistor (FinFET) device, the method comprising:
    providing a substrate having a fin structure;
    forming an isolation region on the substrate and adjacent to the fin structure, the isolation region having a top surface with a first surface profile, the fin structure having an active region above the top surface;
    implanting a dopant species to at least an edge portion of the top surface, which is adjacent to a sidewall surface of the fin structure, the dopant species being implanted with a tilt angle relative to the sidewall surface, the tilt angle being non-perpendicular to the top surface; and
    after implanting the dopant species to at least an edge portion of the top surface, removing at least a portion of the edge portion using an etch process with a first etching rate, the top surface being adjusted from the first surface profile to a second surface profile based on the first etching rate, the first etching rate being greater than a second etching rate used at other portions of the top surface based on the implanted dopant species, the second surface profile having a step height that is smaller than a step height corresponding to the first surface profile.

2. The method of claim 1, wherein implanting the dopant species comprises determining the tilt angle in a range of +1 degrees to +60 degrees.

3. The method of claim 1, wherein the top surface of the isolation region is recessed by the etch process to form a sidewall angle in a range of +45 degrees to −15 degrees, the sidewall angle defined between a surface of the edge portion at the top surface of the isolation region and an axis parallel to a surface of the substrate.

4. The method of claim 1, wherein implanting the dopant species comprises determining the dopant species comprising at least one of an n-type species, a p-type species or a non-biasing material.

5. The method of claim 1, wherein implanting the dopant species comprises determining implant energy in a range of 0.1 KeV to 500 KeV, and wherein the dopant species is implanted with the determined implant energy.

6. The method of claim 1, wherein implanting the dopant species comprises determining an implant dose in a range of $1 \times 10^{12}$ atoms/cm$^2$ to $1 \times 10^{15}$ atoms/cm$^2$, and wherein the dopant species is implanted with the determined implant dose.

7. A method of fabricating a fin field-effect transistor (FinFET) device, the method comprising:
    providing a substrate having a fin structure;
    forming an isolation region on the substrate and adjacent to the fin structure, the isolation region having a top surface with a first surface profile, the fin structure having an active region above the top surface;
    implanting a dopant species to at least an edge portion of the top surface, which is adjacent to a sidewall surface of the fin structure, the dopant species being implanted with a tilt angle relative to the sidewall surface, the tilt angle being non-perpendicular to the top surface;
    forming a gate structure over at least a portion of the fin structure; and
    after implanting the dopant species to at least an edge portion of the top surface, removing at least a portion of the edge portion using an etch process with a first etching rate, the top surface being adjusted from the first surface profile to a second surface profile based on the first etching rate, the first etching rate being greater than a second etching rate used at other portions of the top surface based on the implanted dopant species, the second surface profile having a step height that is smaller than a step height corresponding to the first surface profile.

8. The method of claim 7, wherein the dopant species is implanted before the gate structure is formed.

9. The method of claim 7, further comprising forming side wall spacers over side walls of the gate structure.

10. The method of claim 7, wherein the dopant species is implanted at a tilt angle in a range of +1 degree to +60 degrees.

11. The method of claim 7, wherein the top surface of the isolation region is recessed by the etch process to form a sidewall angle in a range of +45 degrees to −15 degrees, the sidewall angle defined between the sidewall surface and an axis parallel to the top surface.

12. The method of claim 7, wherein the dopant species is implanted with an implant energy in a range of 0.1 KeV to 500 KeV.

13. The method of claim 7, wherein the dopant species is implanted at an implant dose in a range of $1 \times 10^{12}$ atoms/cm$^2$ to $1 \times 10^{15}$ atoms/cm$^2$.

14. A method of fabricating a fin field-effect transistor (FinFET) device, the method comprising:
    providing a substrate having a fin structure;
    forming an isolation region on the substrate and adjacent to the fin structure, the isolation region having a top surface with a first surface profile, the fin structure having an active region above the top surface;
    implanting a dopant species to at least an edge portion of the top surface, which is adjacent to a sidewall surface of the fin structure, the dopant species being implanted with a tilt angle relative to the sidewall surface, the tilt angle being non-perpendicular to the top surface;
    after implanting the dopant species to at least an edge portion of the top surface, removing at least a portion of the edge portion using an etch process with a first etching rate, the top surface being adjusted from the first surface profile to a second surface profile based on the first etching rate, the first etching rate being greater than a second etching rate used at other portions of the top surface based on the implanted dopant species, the second surface profile having a step height that is smaller than a step height corresponding to the first surface profile; and removing at least a portion of the fin structure to recess the fin structure.

15. The method of claim 14, wherein the dopant species is implanted after the fin structure is recessed.

16. The method of claim 15, further comprising removing a remaining portion of the edge portion using a third etch process, the top surface of the isolation region having the second surface profile based on the third etch process.

17. The method of claim 14, wherein the dopant species is implanted at a tilt angle in a range of +1 degree to +60 degrees.

18. The method of claim 14, wherein the top surface of the isolation region is recessed by the etch process to form a sidewall angle in a range of +45 degrees to −15 degrees, the sidewall angle defined between the sidewall surface and an axis parallel to the top surface.

19. The method of claim 14, wherein the dopant species is implanted with an implant energy in a range of 0.1 KeV to 500 KeV.

20. The method of claim 7, wherein the dopant species is implanted at an implant dose in a range of $1\times10^{12}$ atoms/cm$^2$ to $1\times10^{15}$ atoms/cm$^2$.

\* \* \* \* \*